(12) United States Patent
Kobayashi

(10) Patent No.: US 9,129,909 B2
(45) Date of Patent: Sep. 8, 2015

(54) METHOD OF PATTERNING

(71) Applicant: Kabushiki Kaisha Toshiba, Tokyo (JP)

(72) Inventor: Katsutoshi Kobayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/177,755

(22) Filed: Feb. 11, 2014

(65) Prior Publication Data

US 2015/0132964 A1    May 14, 2015

Related U.S. Application Data

(60) Provisional application No. 61/901,703, filed on Nov. 8, 2013.

(51) Int. Cl.
| | |
|---|---|
| G03F 7/00 | (2006.01) |
| H01L 21/311 | (2006.01) |
| H01L 21/02 | (2006.01) |
| H01L 21/027 | (2006.01) |
| G03F 7/004 | (2006.01) |

(52) U.S. Cl.
CPC .......... *H01L 21/31111* (2013.01); *G03F 7/002* (2013.01); *G03F 7/004* (2013.01); *G03F 7/0035* (2013.01); *H01L 21/0271* (2013.01); *H01L 21/02118* (2013.01); *H01L 21/02225* (2013.01); *H01L 21/31144* (2013.01)

(58) Field of Classification Search
CPC ......... G03F 7/004; G03F 7/0002; G03F 7/40; G03F 7/0035; G03F 7/0045; G03F 7/11; H01L 21/0337; H01L 21/0334

USPC .......... 430/270.1, 271.1, 322, 325, 329, 330, 430/331, 312; 438/725, 702, 763, 947
See application file for complete search history.

(56) References Cited

U.S. PATENT DOCUMENTS

| | | | | |
|---|---|---|---|---|
| 7,723,009 | B2 * | 5/2010 | Sandhu et al. | 430/270.1 |
| 8,039,196 | B2 * | 10/2011 | Kim et al. | 430/270.1 |
| 8,053,163 | B2 * | 11/2011 | Yi et al. | 430/270.1 |
| 8,114,573 | B2 * | 2/2012 | Sandhu et al. | 430/270.1 |
| 8,592,940 | B2 * | 11/2013 | Sandhu et al. | 257/506 |
| 8,853,101 | B1 * | 10/2014 | Farrell et al. | 438/780 |
| 2012/0220136 | A1 | 8/2012 | Azuma | |
| 2012/0238109 | A1 | 9/2012 | Hattori et al. | |

FOREIGN PATENT DOCUMENTS

| | | |
|---|---|---|
| JP | 2007-125699 | 5/2007 |
| JP | 2008-38491 | 2/2008 |
| JP | 2010-53263 | 3/2010 |
| JP | 2012-178428 | 9/2012 |
| WO | WO 2011/035816 A1 | 3/2011 |

* cited by examiner

*Primary Examiner* — Amanda C Walke
(74) *Attorney, Agent, or Firm* — Finnegan, Henderson, Farabow, Garrett & Dunner, L.L.P.

(57) ABSTRACT

In a patterning method according to the present embodiment, a guide pattern is formed on a processing target film. The guide pattern is configured by concave portions and convex portions extending in a predetermined direction. A block copolymer layer is formed on the guide pattern. The block copolymer layer contains at least two block chains. A layer of microphase-separated structures is formed on the concave portions and the convex portions, respectively, by microphase-separating the block copolymer layer. The processing target film is formed into predetermined patterns by selectively removing the processing target film. At least a part of the block copolymer layer is used as a mask.

14 Claims, 7 Drawing Sheets

METHOD OF PATTERNING

CROSS REFERENCE TO RELATED APPLICATION

This application is based upon and claims the benefit of priority from the prior U.S. Provisional Patent Application No. 61/901,703 filed on Nov. 8, 2013, the entire contents of which are incorporated herein by reference.

FIELD

Embodiments described herein relate generally to a method of patterning.

BACKGROUND

Conventionally, as a manufacturing method of a semiconductor device, a patterning method for forming a resist pattern using a photolithography technique, etching a processing target film using the resist pattern as a mask, and thereby forming desired patterns on the processing target film is used. In recent years, there is proposed DSA (Directed Self Assembly) Lithography technology for forming fine patterns in a self-aligned manner using a block copolymer so as to form finer patterns.

According to the DSA, the patterns are formed using microphase-separated structures formed in the block copolymer coated onto a processing target film as masks. At this time, a physical guide pattern (a line and space pattern) referred to as "Grapho-epitaxy" is often formed on the processing target film. When the guide pattern is formed, then the microphase-separated structures in the block copolymer coated onto concave portions of the guide pattern are formed along the guide pattern, and the microphase-separated structures regularly arrayed along the guide pattern can be formed on the processing target film.

However, with this patterning method, it is disadvantageously difficult to form patterns on the entire surface of the processing target film because it is impossible to form the regularly arrayed microphase-separated structures on convex portions of the guide pattern.

DETAILED DESCRIPTION

Embodiments will now be explained with reference to the accompanying drawings. The present invention is not limited to the embodiments.

In a patterning method according to the present embodiment, a guide pattern is formed on a processing target film. The guide pattern is configured by concave portions and convex portions extending in a predetermined direction. A block copolymer layer is formed on the guide pattern. The block copolymer layer contains at least two block chains. A layer of microphase-separated structures is formed on the concave portions and the convex portions, respectively by microphase-separating the block copolymer layer. The processing target film is formed into predetermined patterns by selectively removing the processing target film. At least a part of the block copolymer layer is used as a mask.

First Embodiment

Figure 1:
FIGS. 1 to 7b show an example of a pattern ng method according to a first embodiment.

FIGS. 1 to 7b show an example of a patterning method according to a first embodiment. In the patterning method according to the first embodiment, a processing target film 2 is formed first on a substrate 1 as shown in FIG. 1. While the substrate 1 is a silicon substrate, a glass substrate or the like, for example, the substrate 1 is not limited thereto. The processing target film 2 is a silicon film (a Si film) or a silicon oxide film (a $SiO_2$ film, for example) and can be formed on the substrate 1 by a CVD (Chemical Vapor Deposition) method or the like. However, a type and a formation method of the processing target film 2 are not limited to those described above. While FIG. 1 shows that only one layer of the processing target film 2 is formed on the substrate 1, a plurality of layers of processing target films 2 can be stacked and formed on the substrate 1 depending on the intended use.

Figure 2A:
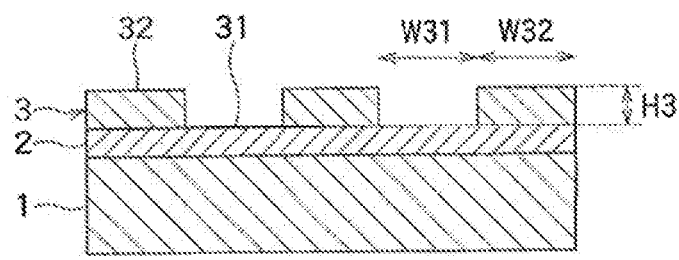
Figure 2B:
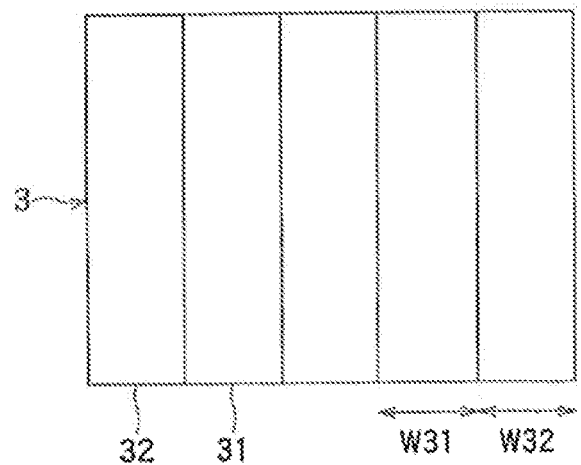

As shown in FIG. 2a, a guide pattern 3 is formed on the processing target film 2. The guide pattern 3 is a physical guide (Grapho-epitaxy) for forming microphase-separated structures of a block copolymer in a regularly arrayed manner. The microphase-separated structures are formed with a surface of the guide pattern 3 used as a base point. The guide pattern 3 is configured by a plurality of concave portions 31 and a plurality of convex portions 32, and formed on the processing target film 2 so that the concave portions 31 and the convex portions 32 extend in a predetermined direction. That is, as shown in FIG. 2b, the guide pattern 3 provides a guide for forming line and space patterns on the processing target film 2.

For example, the guide pattern 3 can be formed by coating a material containing silicon oxide ($SiO_2$ or the like) or a C (carbon)-based material such as a resist material on the processing target film 2, and removing a part of the coated material by a dry etching method. Alternatively, a resist pattern formed on the processing target film 2 by a photolithography technique or the like can be used as the guide pattern 3 as it is.

A width W31 of each concave portion 31 and a width W32 of each convex portion 32 of the guide pattern 3 are designed to satisfy predetermined width conditions so as to suppress the formation of defects or a grain structure in the microphase-separated structures in processes of forming the microphase-separated structures (described later). For example, the width W31 of each concave portion 31 is designed so as to be substantially an integer multiple of a phase separation cycle of the block copolymer, that is, a length L between two proximal microdomains 41 formed in a block copolymer layer 4 (see FIG. 5a). The widths W31 of the respective concave portions 31 can be set to be either identical to one another or, as long as the width conditions described above are satisfied, different from one another. Similarly, the width W32 of each convex portion 32 is designed so as to be substantially an integer multiple of the length L. The widths W32 of the respective convex portions 32 can be set to be either identical to one another or, as long as the width conditions described above are satisfied, different from one another.

The height of the guide pattern 3, that is, a height H3 from surfaces of the concave portions 31 to surfaces of the convex portions 32 is designed to satisfy predetermined height conditions so as to form only one layer of the microphase-separated structures on each of the concave portions 31. For example, the height H3 is designed to be equal to or larger than a 0.5-fold of the length L and equal to or smaller than a 1.5-fold of the length L. Preferably, the height H3 is designed to be equal to or larger than the 0.5-fold of the length L and equal to or smaller than a 1.0-fold of the length L so as to ensure forming only one layer of the microphase-separated structures on each of the concave portions 31.

Figure 3A:
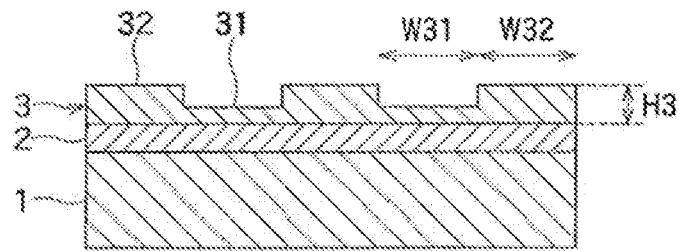
Figure 3B:
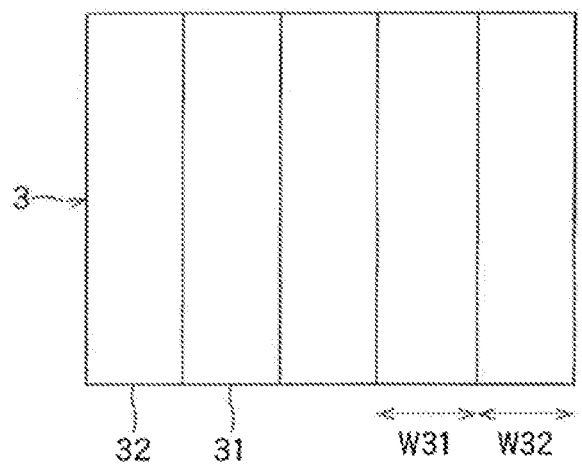

The concave portions 31 of the guide pattern 3 are formed so that the processing target film 2 is exposed to a surface as shown in FIG. 2a; alternatively the concave portions 31 can be formed so that the processing target film 2 is not exposed to the surface as shown in FIG. 3a. As described above, even if the processing target film 2 is covered with the guide pattern 3, one layer of the microphase-separated structure can be formed on each of the concave portions 31 and the convex portions 32 as long as the guide pattern 3 satisfies the width conditions and the height conditions described above. Therefore, in an etching process described later, the guide pattern 3 as well as the processing target film 2 can be etched and the line and space patterns can be formed on the processing target film 2.

Figure 4:
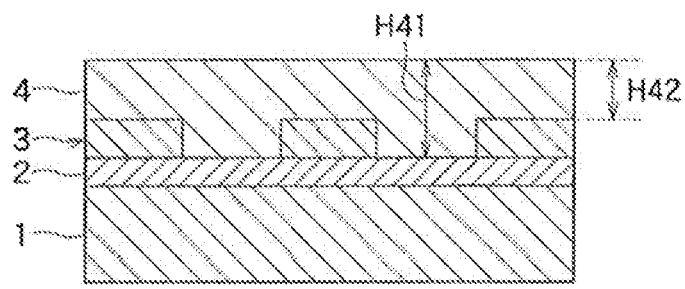

As shown in FIG. 4, the block copolymer layer 4 is formed on the guide pattern 3 so as to cover the concave portions 31 and the convex portions 32. The block copolymer layer 4 can be formed by coating a solvent in which the block copolymer is dissolved on the guide pattern 3 by a spin-coating method or the like.

Heights of respective parts of the block copolymer layer 4 are designed to satisfy the predetermined height conditions so as to form only one layer of the microphase-separated structures on the guide pattern 3 in the processes of forming the microphase-separated structures (described later). For example, a height H41 from the surfaces of the concave portions 31 to a surface of the block copolymer layer 4 is designed to be equal to or larger than the 0.5-fold of the length L and equal to or smaller than the 1.5-fold of the length L similarly to the height. H3. Similarly, a height H42 from the surfaces of the convex portions 32 to the surface of the block copolymer layer 4 is designed to be equal to or larger than the 0.5-fold of the length L and equal to or smaller than the 1.5-fold of the length L.

In FIG. 4, the surface of the block copolymer layer 4 is flat, and the height. H41 from the surfaces of the concave portions 31 to the surface of the block copolymer layer 4 is a sum (H41=H3+H42) of the height H3 of the guide pattern 3 and the height H42 from the surfaces of the convex portions 32 to the surface of the block copolymer layer 4. However, the surface of the block copolymer layer 4 actually has smooth irregularities in proportion to the concave portions 31 and the convex portions 32 of the guide pattern 3. Therefore, the surface of the block copolymer layer 4 on the concave portions 31 is lower than the surface of the block copolymer layer 4 on the convex portions 32 (H41<H3+H42). For this reason, the heights H3, H41, and H42 are designed to satisfy the height conditions described above in view of the lowered surface of the block copolymer layer 4 on the concave portions 31.

At the time of forming the block copolymer layer 4, the number of rotations, rotation time, and the like in relation to the spin-coating method are adjusted so that the heights of the respective parts of the block copolymer layer 4 can be made equal to the designed heights as described above.

The block copolymer layer 4 is formed by using a diblock copolymer or a triblock copolymer that contains at least two block chains and that forms the microphase-separated structures. Examples of such block copolymer include polybutadiene-polydimethylsiloxane, polybutadiene-4-vinylpyridine, polybutadiene-methyl methacrylate, polybutadiene-poly-t-butyl methacrylate, polybutadiene-t-butyl acrylate, poly-t-butyl methacrylate-poly-4-vinylpyridine, polyethylene-polymethyl methacrylate, poly-t-butyl methacrylate-poly-2-vinylpyridine, polyethylene-poly-2-vinylpyridine, polyethylene-poly-4-vinylpyridine, polyisoprene-poly-2-vinylpyridine, poly-t-butyl methacrylate-polystyrene, polymethyl acrylate-polystyrene, polybutadiene-polystyrene, polystyrene-poly-2-vinylpyridine, polystyrene-poly-N, N-dimethyl acrylamide, polybutadiene-sodium polyacrylate, polybutadiene-polyethylene oxide, poly-t-butyl methacrylate-polyethylene oxide, polystyrene-polyacrylate, polystyrene-polymethacrylic acid, polystyrene-polymethyl methacrylate (PS-PMMA), polystyrene-polyethylene oxide (PS-PEO), polystyrene-polydimethylsiloxane (PS-PDMS), polystyrene-polyisoprene (PS-PI), polystyrene-poly-4-vinylpyridine (PS-P4VD), and polymethyl methacrylate-polymethacrylate containing polyhedral oligomeric silsesquioxane (PMMA-PMAPOSS).

Figure 5A:
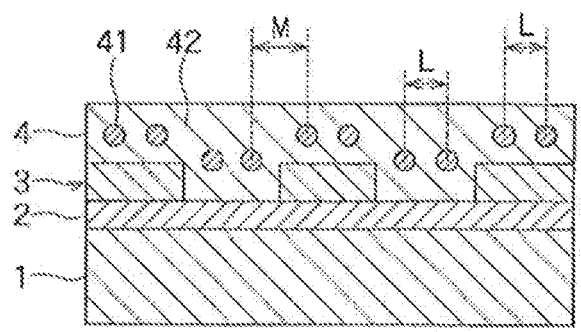
Figure 5B:
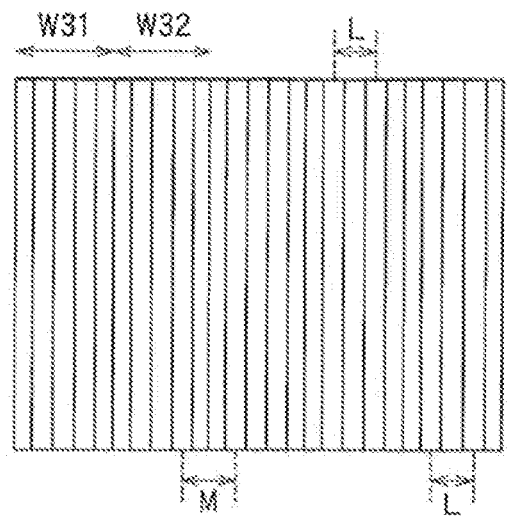
Figure 5C:
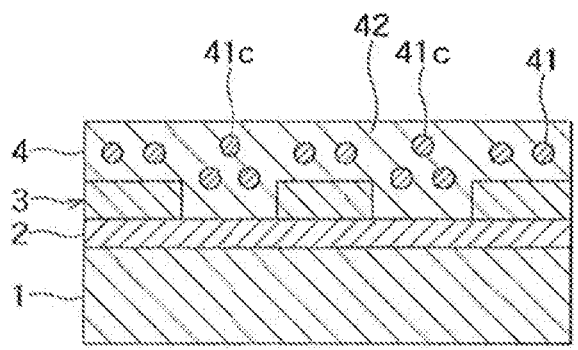

Next, a heat treatment is performed to the block copolymer layer 4 to cause microphase separation of the block copolymer 4, thereby forming cylindrical microdomains 41 in the block copolymer layer 4 as shown in FIGS. 5a to 5c. The temperature and time of the heat treatment can be selected based on the block copolymer to be used. For example, the microphase separation of the block copolymer layer 4 can be caused by performing an annealing treatment at 250° C.

When microphase-separating the block copolymer layer 4, self-assembled microphase-separated structures are formed in the block copolymer layer 4. As shown in FIG. 5a, the microphase-separated structures are configured to include a continuous phase 42 and the microdomains 41 regularly arrayed in the continuous phase 42. In this embodiment, one layer of the microphase-separated structures is formed on each of the concave portions 31 and the convex portions 32 of the guide pattern 3 because the height H3 of the guide pattern 3 and the heights H41 and H42 of the block copolymer layer 4 are designed to satisfy the height conditions described above. That is, one layer of the structures configured by the microdomains 41 and the continuous phase 42 surrounding the microdomains 41 is formed on each of the concave portions 31 and the convex portions 32. Therefore, in this embodiment, a plurality of layers of microphase-separated structures (microdomains 41c) stacked in a vertical direction as shown in FIG. 5c are not formed.

FIG. 5b is a plan view of FIG. 5a in which the continuous phase 42 is seen through. As shown in FIG. 5b, the microdomains 41 are cylindrical microdomains in parallel to the guide pattern 3.

The microdomains 41 formed on the concave portions 31 and the convex portions 32 of the guide pattern 3 are regularly arrayed at a predetermined interval (the length L) from the proximal microdomains 41. The length L is determined according to a composition ratio or the like of the block chains contained in the block copolymer. The number of the microdomains 41 formed on each of the concave portions 31 or each of the convex portions 32 is determined according to the width W31 or W32. For example, when the widths W31 and W32 are designed to be about N times (where N is an integer) as large as the length L, N microdomains 41 are formed on each of the concave portions 31 and the convex portions 32.

In this embodiment, because the widths W31 and W32 of the guide pattern 3 is designed so as to satisfy the width conditions, the formation of defects or the grain structure is suppressed. A length M between the microdomain 41 formed on one concave portion 31 and the microdomain 41 formed on one convex portion 32 can be adjusted by designing the widths W31 and W32 according to the block copolymer to be used.

Figure 6A:
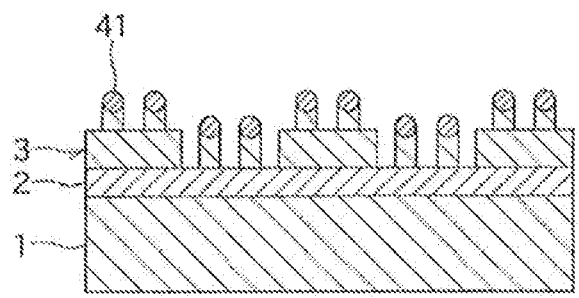
Figure 6B:
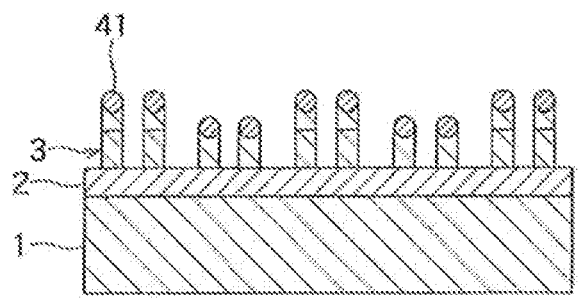
Figure 6C:
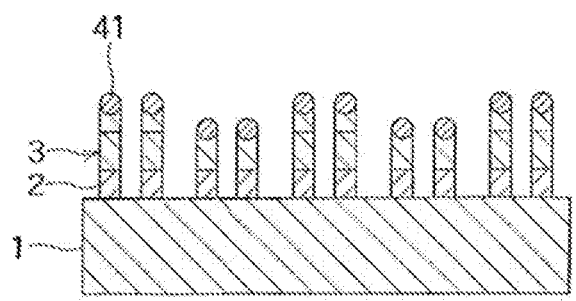

The processing target film 2 is dry etched using at least a part of the block copolymer layer 4 as a mask. In this embodiment, the processing target film 2 is dry etched using the microdomains 41 as masks as shown in FIGS. 6a to 6c. More specifically, first, as shown in FIG. 6a, the continuous phase 42 is etched using the microdomains 41 as masks. The material of the block copolymer is selected so that an etching rate of continuous phase 42 is higher than that of microdomains 41. Alternatively, an etching method is selected so that the etching rate of continuous phase 42 is higher than that of microdomains 41.

As shown in FIG. 6b, the guide pattern 3 is etched using the microdomains 41 as masks. The material of the convex portions 32 of the guide pattern 3 is selected so that an etching rate of convex portions 32 is higher than that of microdomains 41. Alternatively, an etching method is selected so that the etching rate of convex portions 32 is higher than that of microdomains 41.

As shown in FIG. 6c, the processing target film is selectively removed by etching using the microdomains 41 as masks. The material of the processing target film 2 is selected so that an etching rate of the processing target film 2 is higher than that of microdomains 41. Alternatively, an etching method is selected so that the etching rate of processing target film 2 is higher than that of microdomains 41.

Either the same method or different methods can be used as the etching methods used in tree respective processes shown in FIGS. 6a to 6c. The continuous phase 42 and the guide pattern 3, the guide pattern 3 and the processing target film 2, or the continuous phase 42, the guide pattern 3, and the processing target film 2 can be etched simultaneously. In any case, the materials or the etching methods of the continuous phase 42, the guide pattern 3, and the processing target film 2 are selected so that selective ratio about RIE of these materials is higher than that of microdomains 41 used as masks.

Figure 7A:
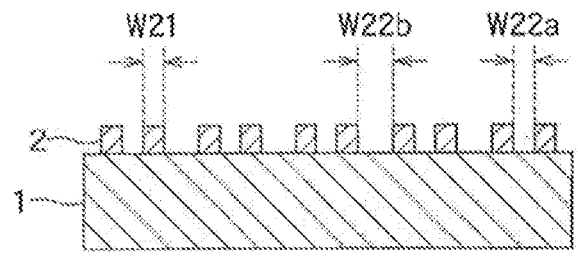
Figure 7B:
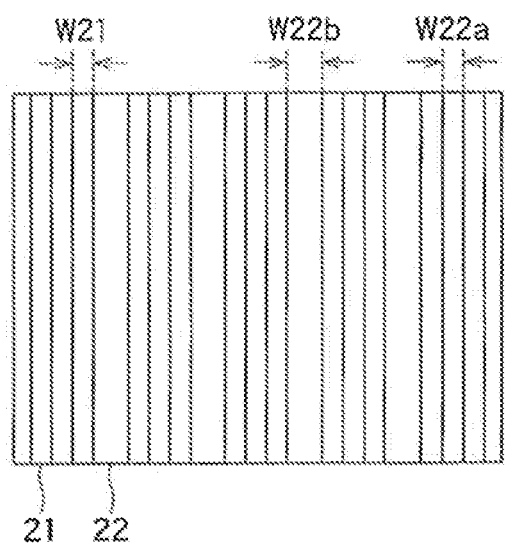

Next, as shown in FIG. 7a, residues (the microdomains 41, the continuous phase 42, the guide pattern 3, and the like) on the processing target film 2 are removed. The residues can be removed using a wet etching method, a CMP (Chemical Mechanical Polishing) method, a dry etching method or the like. Predetermined patterns by the processing target film 2 are thereby formed on a surface of the substrate 1. In a case where the microdomains 41 are the cylindrical microdomains in parallel to the guide pattern 3 as described in this embodiment, the line and space patterns in parallel to the guide pattern 3 are formed on the substrate 1 as shown in FIG. 7b.

A width W21 of each of line parts 21 of the formed line and space patterns is substantially equal to a size in a radial direction of each of the microdomains 41. Therefore, it is possible to form the equal-width line parts 21 on the entire surface of the substrate 1.

A width W22 (W22a, W22b) of each of space parts 22 of the line and space patterns is equal to the length between end portions of the two proximal microdomains 41. Therefore, the width W22 of the space part 22 between the line parts 21 formed using the microdomains 41 formed on one concave portion 31 of the guide pattern 3 as masks and the width W22 of the space part 22 between the line parts 21 formed using the microdomains 41 formed on one convex portion 32 of the guide pattern 3 as masks are equal, that is, W22a. The width W22a of each space part 22 is a value obtained by subtracting the width W21 of the line part 21 from the length L between the two proximal microdomains 41 (W22a=L−W21).

Because the length L and the width W21 are determined according to the block copolymer to be used, the width W22a is also determined according to the block copolymer to be used. Therefore, it is possible to form the line and space pattern that includes the predetermined-width line parts 21 and the predetermined-width space parts 22 in a portion on the processing target film 2 where each of the concave portions 31 and the convex portions 32 is formed.

The width W21 of each line part 21 and the width W22 of each space part 22 are determined according to the block copolymer to be used, and at least one of the widths W21 and W22 can be set to be equal to or smaller than 10 nm. Preferably, examples of the block copolymer for forming the line and space patterns for which at least one of the width W21 of the line part 21 and the width W22 of the space part 22 is equal to or smaller than 10 nm include polystyrene-polyethylene oxide (PS-PEO), polystyrene-polydimethylsiloxane (PS-PDMS), polystyrene-polyisoprene (PS-PI), polystyrene-poly-4-vinylpyridine (PS-P4VD), and polymethyl methacrylate-polymethacrylate containing polyhedral oligomeric silsesquioxane (PMMA-PMAPOSS).

The width W22b of the space part 22 between the line part 21 formed using the microdomains 41 formed on one concave portion 31 of the guide pattern 3 as masks and the line part 21 formed using the microdomains 41 formed on one convex portion 32 of the guide pattern 3 as masks can be designed to a predetermined value by adjusting the width W31 of the concave portion 31 and the width W32 of the convex portion 32. For example, the widths W31 and 132 are designed so that the length M is equal to the length L, thereby it is possible to make the width W22b equal to the width W22a. It is thereby possible to form the line and space patterns including the predetermined-width line parts 21 and the predetermined-width space parts 22 on the entire surface of the substrate 1.

As described above, with the patterning method according to this embodiment, one layer of the microphase-separated structures can be formed on each of the concave portions 31 and the convex portions 32 of the guide pattern 3, and the processing target film 2 can be etched using a part of the formed microphase-separated structures as masks. It is thereby possible to form the line and space pattern having the predetermined widths determined according to the microphase-separated structures in the one layer of which is formed on each concave portion 31 in the portion on the processing target film 2 where the concave portion 31 is formed. Similarly, it is possible to form the line and space pattern having the predetermined widths determined according to the microphase-separated structures in the one layer of which is formed on each convex portion 32 in the portion on the processing target film 2 where the convex portion 32 is formed. Therefore, it is possible to form finer patterns than those formed by means of a photolithography technique on the entire surface of the substrate 1 without using any complicated processes such as double patterning processes.

Furthermore, it is possible to suppress the formation of the defects or the grain structure in the microphase-separated structures because the widths and heights of the respective parts of the guide pattern 3 and the block copolymer layer 4 are designed to satisfy the width conditions and the height conditions described above. Therefore, it is possible to form the regularly arrayed line and space patterns.

Second Embodiment

A patterning method according to a second embodiment is described with reference to FIGS. 8a to 8f. In this embodiment, the continuous phase 42 is used as an etching mask for the processing target film 2. FIGS. 8a to 8f show an example of etching processes according to this embodiment.

Figure 8D:
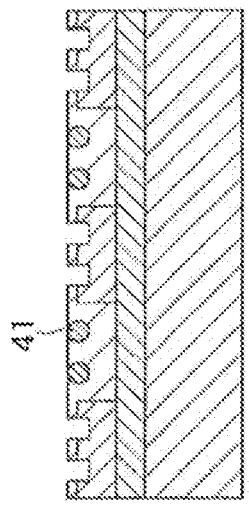
FIGS. 8a to 8f show an example of etching processes of a patterning method according to a second embodiment.
Figure 8E:
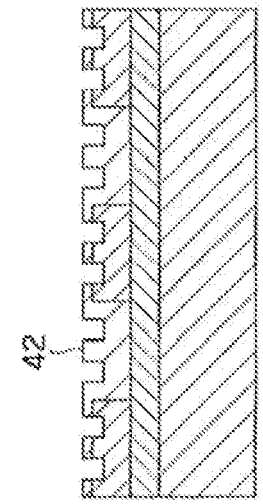
Figure 8F:
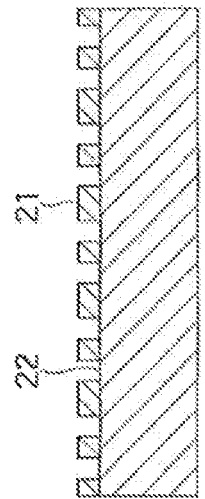
Figure 8A:
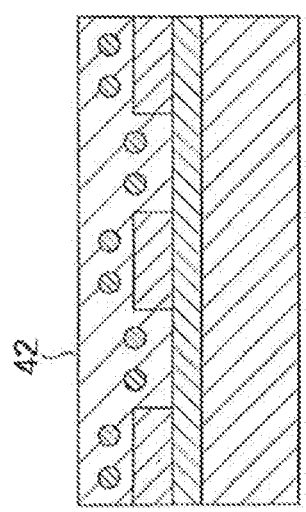
Figure 8B:
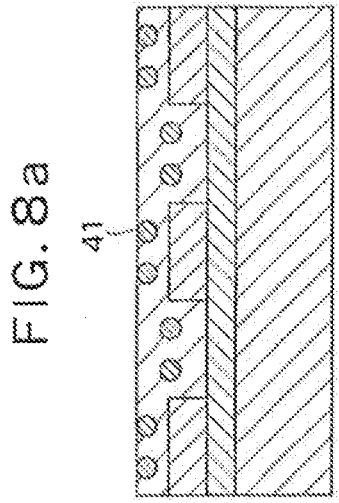

First, as shown in FIG. 8a, the substrate 1 including the microphase-separated structures is formed by a similar method to that according to the first embodiment. As shown in FIG. 8b, the continuous phase 42 is removed by an etching method until the microdomains 41 are exposed to the surface. The continuous phase 42 can be removed by a method other than the etching method.

Figure 8C:
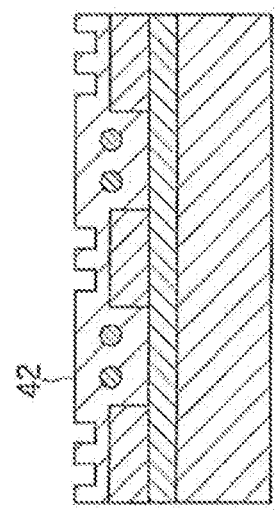

After the microdomains 41 are exposed to the surface, the microdomains 41 are removed by an etching method as shown in FIG. 8c. The material of the block copolymer is selected so that the etching rate of the microdomains 41 is higher than that of the continuous phase 42. Alternatively, the etching method is selected so that the etching rate of the microdomains 41 is higher than that of continuous phase 42.

After removing the microdomains 41, the continuous phase 42 is removed by an etching method until the microdomains 41 are exposed to the surface as shown in FIG. 8d. The continuous phase 42 can be removed by a method other than the etching method. Furthermore, a part of the convex portions 32 of the guide pattern 3 can be removed simultaneously with the continuous phase 42.

After the microdomains 41 are exposed to the surface, the microdomains 41 are removed by an etching method as shown in FIG. 8e. Concave and convex portions are thereby formed on a surface of the continuous phase 42 (and a part of the convex portions 3 of the guide pattern 3). By etching the processing target film 2 using the convex portions of the continuous phase 42 as masks, the line and space patterns can be formed on the processing target film 2 as shown in FIG. 8f. The line parts 21 and the space parts 22 of the line and space patterns formed as described above are opposite to the line parts 21 and the space parts 22 of the line and space patterns formed in the first embodiment. That is, in the line and space patterns according to the second embodiment, portions where the line parts 21 are formed in the first embodiment correspond to the space parts 22 and portions where the space parts 22 are formed in the first embodiment correspond to the line parts 21. Therefore, it is possible to form the equal-width space parts 22 on the entire surface of the substrate 1.

When the residues are present on the processing target film 2 at the time of forming the line and space patterns shown in FIG. 8f, the residues can be removed using a wet etching method, the CMP method or the like and the surface of the processing target film 2 can be planarized.

Third Embodiment

Figure 9A:
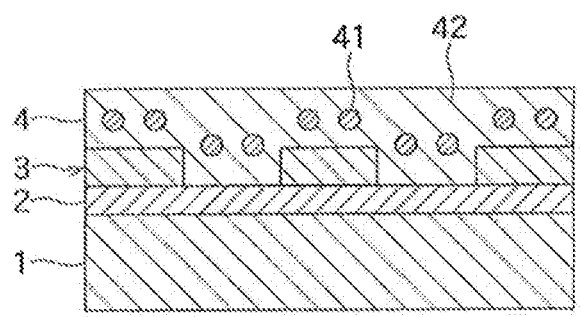
FIGS. 9a and 9b show an example of a patter ding method according to a third embodiment.
Figure 9B:
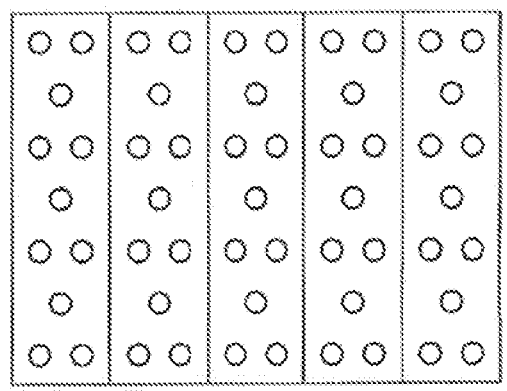

A patterning method according to a third embodiment is described with reference to FIGS. 9a and 9b. In this embodiment, spherical microdomains 41 are formed in the block copolymer layer 4. FIGS. 9a and 9b show an example of the microphase-separated structures according to this embodiment.

In this embodiment, when the microphase separation of the block copolymer layer 4 is caused, one layer of the microphase-separated structures (the microdomains 41) is formed on each of the concave portions 31 and the convex portions 32 of the guide pattern 3.

FIG. 9b is a plan view of FIG. 9a in which the continuous phase 42 is seen through. Generally, the spherical microdomains are arranged to have a hexagonal closest-packed structure. Accordingly, in this embodiment in which only one layer of the microdomains 41 is formed on each of the concave portions 31 and the convex portions 32, the microdomains 41 are arranged to form continuous equilateral triangles within the width of each of the concave portions 31 and the convex portions 32. The length between the two proximal microdomains 41 is the same as the length L according to the first embodiment. The number of microdomains 41 formed on each of the concave portions 31 or the convex portions 32 is determined according to the width W31 or W32. For example, when the widths W31 and W32 are designed to be about N times (where N is an integer) as large as the length L, lines on which the N microdomains 41 are arranged in a width direction and lines on which the N−1 microdomains 41 are arranged in the width direction are alternately formed on the concave portions 31 and the convex portions 32.

By etching the processing target film 2 using such microdomains 41 as masks, cylindrical holes can be formed in the processing target films 2. By etching the processing target film 2 using the continuous phase 42 as a mask, cylindrical protrusions can be formed on the processing target film 2. The processing target film 2 can be etched by the method explained in the first or second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A patterning method comprising;
   forming a guide pattern on a processing target film, the guide pattern being configured by concave portions and convex portions extending in a predetermined direction;
   forming a block copolymer layer on the guide pattern, the block copolymer layer containing at least two block chains;
   forming a layer of microphase-separated structures on the concave portions and the convex portions, respectively, by microphase-separating the block copolymer layer, the microphase-separated structures including spherical microdomains; and
   forming the processing target film into predetermined patterns by selectively removing the processing target film using at least a part of the block copolymer layer as a mask.

2. The method of claim 1, wherein the guide pattern is formed in such a manner that a height from surfaces of the concave portions to surfaces of the convex portions is equal to or larger than a 0.5-fold of a length between the two proximal microdomains and equal to or smaller than a 1.5-fold of the length.

3. The method of claim 1, wherein the guide pattern is formed in such a manner that widths of the concave portions and the convex portions are substantially integer multiples of a length between the two proximal microdomains.

4. The method of claim 1, wherein the block copolymer layer is formed in such a manner that a height from surfaces of the convex portions of the guide pattern to a surface of the block copolymer layer is equal to or larger than a 0.5-fold of a length between the two proximal microdomains and equal to or smaller than a 1.5-fold of the length.

5. The method of claim 1, wherein the processing target film is removed using the microdomains as masks.

6. The method of claim 1, comprising removing residues on the processing target film after removing the processing target film.

7. The method of claim 1, wherein the block copolymer is configured to include any one of polystyrene-polymethyl methacrylate (PS-PMMA), polystyrene-polyethylene oxide (PS-PEO), polystyrene-polydimethylsiloxane (PS-PDMS), polystyrene-polyisoprene (PS-PI), polystyrene-poly-4-vinylpyridine (PS-P4VD), and polymethyl methacrylate-polymethacrylate containing polyhedral oligomeric silsesquioxane (PMMA-PMAPOSS).

8. The method of claim 1, wherein the microphase separation of the block copolymer layer is caused by performing an annealing treatment.

9. The method of claim 1, wherein the guide pattern is formed by silicon oxide or a resist material.

10. The method of claim 1, wherein the block copolymer layer is formed by a spin-coating method.

11. The method of claim 10, wherein number of rotations and rotation time in relation to the spin-coating method are adjusted in such a manner that the block copolymer layer is formed to have a predetermined height.

12. The method of claim 1, wherein the processing target film is a silicon film or a silicon oxide film.

13. The method of claim 1, wherein the block copolymer layer is formed in such a manner that a surface of the block copolymer layer on the concave portions of the guide pattern is lower than the surface of the block copolymer layer on the convex portions of the guide pattern.

14. The method of claim 1, wherein a height from the spherical microdomain to the guide pattern or the processing target film is smaller than a height from a surface of the block copolymer layer to a surface of the processing target film which contacts the block copolymer layer or the convex portions of the guide pattern.

* * * * *